United States Patent [19]

Tsutsumi et al.

[11] Patent Number: 5,336,272
[45] Date of Patent: Aug. 9, 1994

[54] METHOD FOR MOLDING A SEMICONDUCTOR PACKAGE ON A CONTINUOUS LEADFRAME

[75] Inventors: Yasutsugu Tsutsumi; Sueyoshi Tanaka, both of Fukuoka, Japan

[73] Assignee: Mitsubishi Denki Kabushiki Kaisha, Tokyo, Japan

[21] Appl. No.: 876,306

[22] Filed: Apr. 30, 1992

Related U.S. Application Data

[60] Division of Ser. No. 790,016, Nov. 5, 1991, Pat. No. 5,134,458, which is a continuation of Ser. No. 404,882, Sep. 8, 1989, abandoned.

[30] Foreign Application Priority Data

Oct. 13, 1988 [JP] Japan .................. 63-257720

[51] Int. Cl.⁵ .................... H01L 21/28; H01L 21/60; B28B 7/00; B29C 43/22
[52] U.S. Cl. .................... 29/25.01; 437/207; 437/214; 437/220; 264/272.17; 425/122; 425/451.9
[58] Field of Search ........ 437/214, 220, 207; 264/272.14, 272.17, 297.2, 297.8; 425/121, 122, 451.9, DIG. 47, DIG. 48; 29/25.01

[56] References Cited

U.S. PATENT DOCUMENTS

| | | | |
|---|---|---|---|
| 3,768,986 | 10/1973 | Ramos et al. | 29/191.6 |
| 4,003,073 | 10/1973 | Helda et al. | 357/70 |
| 4,012,766 | 3/1977 | Phillips et al. | 357/70 |
| 4,173,621 | 11/1979 | Yamamoto et al. | 437/226 |
| 4,345,889 | 8/1982 | Sizemorr et al. | 425/121 |
| 4,400,714 | 8/1983 | Brown | 357/70 |
| 4,680,617 | 7/1987 | Ross | 357/72 |
| 4,816,426 | 3/1989 | Bridges et al. | 437/207 |
| 4,942,455 | 7/1990 | Shinohara | 357/70 |

FOREIGN PATENT DOCUMENTS

| | | | |
|---|---|---|---|
| 53124075 | 10/1978 | Japan | 437/207 |
| 55118640 | 9/1980 | Japan | 224/272.17 |
| 5682218 | 7/1981 | Japan | 425/122 |
| 58110048 | 6/1983 | Japan | 437/207 |
| 59175130 | 10/1984 | Japan | 437/220 |
| 6141134 | 9/1986 | Japan | 437/217 |
| 6213094 | 1/1987 | Japan | 264/272.17 |
| 63207160 | 8/1988 | Japan | 437/214 |

Primary Examiner—Olik Chaudhuri
Assistant Examiner—David E. Graybill
Attorney, Agent, or Firm—Oblon, Spivak, McClelland, Maier & Neustadt

[57] ABSTRACT

A method and apparatus for sealing a semiconductor wherein an upper seal block of a cope and a lower seal block of a drag are provided with sealants for nipping a portion of a long size lead frame, so that the airtightness of a cavity enclosed with the cope and drag can be completely kept. The long size lead frame may have a continuing part extending from one of two side members to the other, provided between adjacent lead patterns to be pressed by the sealants, so that the airtightness of the cavity can be further completely kept.

4 Claims, 5 Drawing Sheets

METHOD FOR MOLDING A SEMICONDUCTOR
PACKAGE ON A CONTINUOUS LEADFRAME

This is a division of application Ser. No. 07/790,016, filed on Nov. 5, 1991, now U.S. Pat. No. 5,134,458, which is a continuation of application Ser. No. 07/404,882, filed on Sep. 8, 1989, which has been abandoned.

BACKGROUND OF THE INVENTION

1. Field of the Invention

The present invention relates to a method of sealing a semiconductor element with resin and a vacuum type resin-sealing apparatus and a long size lead frame for use in the method.

2. Description of the Background Art

FIG. 1 is a cross-sectional view showing a conventional vacuum type resin-sealing apparatus which includes a cope 1 and a drag 10 disposed on opposite sides of a parting plane A—A. FIG. 2 is a plan view showing the drag 10 viewed from the parting plane A—A. Referring to FIG. 1, the cope 1 comprises a rectangular upper wall 2 and an upper cavity block 3 provided on the underside of the upper wall 2. The upper cavity block 3 is provided with a number of recesses or cavities 4A arranged in two rows. On the underside of the upper wall 2, a circular upper seal block 5 is also provided to surround the upper cavity block 3. The upper seal block 5 is provided with a vacuum air outlet 6 which penetrates the upper seal block 5 and is connected with a vacuum equipment 40 such as a vacuum pump. The upper seal block 5 is also provided on the upper wall 2 side surface thereof with a sealant 7A of silicone rubber or teflon. A chamber wall 8A penetrates the upper wall 2 and the cavity block 3 to form a chamber 8. The chamber wall 8A is fixed by means of e flange 9. A sealant 7B around the chamber wall 8A is provided between the upper wall 2 and the chamber wall 8A. Thus, the cope 1 is structured.

The cross section of the drag 10 of FIG. 1 is taken along line B—B of FIG. 2. The cross section of the cope 1 of FIG. 1 is also taken along line B—B of FIG. 2 except for the chamber 8 and the neighborhood thereof, the cross section of which is taken along line C—C of FIG. 2.

The drag 10 comprises a rectangular lower wall 11 and a lower cavity block 12 provided on the top surface of the lower wall 11. The lower cavity block 12 is provided with a number of recesses or cavities 4B arranged in two rows as well as a pot 13, a runner 14 and gates 15 which are formed by recessing the lower cavity block 12. The chamber 8 in the cope 1 is opposed to the pot 13, and the cavities 4A in the cope 1 are opposed to the cavities 4B. In a closed state of the cope 1 and drag 2, the chamber 8 leads to the cavities 4A and 4B through the pot 13, the runner 14 extending from the pot 13 as a trench and the gates 15 branching in both sides of the runner 14. On the top surface of the lower wall 11, a circular lower seal block 16 is also provided to surround the lower cavity block 12. The lower seal block 16 is opposed to the upper seal block 5 in the cope 1. The lower seal block 16 is provided with a sealant 7C on the lower wall 11 side surface thereof and a sealant 7D on the cope 1 side surface thereof. Positioning pins 17 are provided at four corners of the lower wall 11 as shown in FIG. 2. Thus, the drag 10 is structured.

A plunger 18 is slidably inserted in the chamber 8. The plunger 18 is provided with a sealant 7E therearound. In the closed state of the cope 1 and drag 2, short size lead frames 19 are held between the upper and lower cavity blocks 3 and 12 at predetermined positions with respect to the cavities 4A and 4B.

FIG. 3 is a plan view showing the short size lead frame 19 which comprises two stripe side members 20 extending in parallel at a distance. The side members 20 are provided with a plurality of holes 21 along the extending direction. Between the side members 20, a plurality of lead patterns 22 are provided, which are structured as follows: A plurality of element mounting pads 23 are supported by supporting arms 24 connecting the element mounting pads 23 to the side members 20. A plurality of inner leads 25 are disposed around each element mounting pad 23. The inner leads 25 lead to outer leads 26. The inner and outer leads 25 and 25 are connected to each other and to the side members 20 through tie bars 27 for supporting these leads 25 and 26. Thus, the lead patterns 22 are structured.

An unit lead pattern for one semiconductor element is defined in an interval M between dashed lines L, wherein the element mounting pad 23 is disposed at the center of the unit lead pattern. A plurality of such unit lead patterns are arranged along the side members 20 at regular intervals M.

A procedure of sealing a semiconductor element with resin will be described. In a pretreatment, semiconductor elements are mounted on the element mounting pads 23 and electrically connected with the inner leads 25 through bonding wires. In this pretreatment process, after the finish of treatment of one of the semiconductor elements, the short size lead frame 19 is moved by one pitch M by using the holes 21 of the side members 20 to treat next one of the semiconductor elements, and thus the treatment is repeated.

The short size lead frame 19 thus pretreated, which is smaller in size then the lower cavity block 12 as shown in FIG. 2, is positioned on the lower cavity block 12 in a manner that each semiconductor element on the element mounting pad 23 is located in the center of each cavity 4B and then held by the cope 1 and the drag 2 clamped by a clamp machine (not shown). Thereafter, preheated tablet resin is put in the chamber 8. The sealant 7A to 7E completely seal between the upper and lower walls 2 and 11, the upper and lower seal blocks 5 and 16, the chamber wall 8A and the plunger 18 so that the inner space enclosed with these is kept airtight.

The plunger 18 is pushed down up to just before coming in contact with the tablet resin and then evacuation through the vacuum air outlet 6 takes place. The resin is heated through surroundings to be melted, so as to be injected into the cavities 4A and 4B through the pot 13, the runner 14 and the gates 15 by further pushing down the plunger 18. Thus, the resin is molded in a shape corresponding to the cavities 4A and 4B at both sides of the lead frame 19 in a region N surrounded with a dashed line in FIG. 3, so that each semiconductor element is sealed in the molded resin.

The conventional vacuum type resin-sealing apparatus structured as hereinbefore described is provided with the sealant 7D only on the drag 11 with respect to the parting plane A—A. Therefore when this apparatus is employed for sealing with resin a long size lead frame which is longer than the cope 1 and the drag 10, a vacuum cannot be obtained in the inner space enclosed with the cope 1 and the drag 10 since the inner space can not be kept airtight at portions where the long size lead frame is nipped by the cope 1 and the drag 10. If the resin is injected in this state, air left in the chamber 8, runner 14, cavities 4A and 4B and the like is mixed into the resin to become bubbles. This results in decrease of the quality of the molded resin.

SUMMARY OF THE INVENTION

In the first aspect of the present invention, a method of sealing a semiconductor element mounted on a long size lead frame with resin by using a vacuum type resin-sealing apparatus having a cope and a drag comprises the steps of nipping a portion of the long size lead frame by the cope and drag to seal between the cope, the drag and the long size lead frame, evacuating a cavity enclosed with the cope and drag, and injecting resin into the cavity to seal the semiconductor element with the resin.

In the second aspect of the present invention, a vacuum type resin-sealing apparatus for sealing a semiconductor element mounted on a long size lead frame with resin comprises a cope and a drag provided opposite to each other with respect to a parting plane, sealing means for sealing between the cope, the drag and the long size lead frame in a state where a portion of the long size lead frame is nipped by the cope and drag, evacuating means for evacuating a cavity enclosed with the cope and drag, and injecting means for injecting resin into the cavity to seal the semiconductor element with the resin.

In the third aspect of the present invention, a long size lead frame having semiconductor elements mounted thereon to be sealed with resin by using a vacuum type resin-sealing apparatus comprises two stripe side members extending in parallel at a distance, a plurality of lead patterns arranged between the side members at regular intervals, each lead pattern having an element mounting pad for mounting thereon each semiconductor element and inner leads disposed around the element mounting pad, and a continuing part extending from one of the side members to the other, provided between adjacent lead patterns to be pressed by sealing means of the vacuum type resin-sealing apparatus.

According to a method of sealing a semiconductor element in accordance with the present invention, a portion of a long size lead frame is nipped by a cope and a drag to seal between the cope, the drag and the long size lead frame, so that a cavity enclosed with the cope and drag can be completely maintained airtight.

According to a vacuum type resin-sealing apparatus in accordance with the present invention, there is provided sealing means for sealing between a cope, a drag and a long size lead frame when a portion of the long size lead frame is nipped by the cope and drag, so that a cavity enclosed with the cope and drag can be completely kept airtight.

According to a long size lead frame in accordance with the present invention, there is provided a continuing part extending from one of side members to the other, disposed between adjacent lead patterns to be pressed by sealing means of a vacuum type resin-sealing apparatus, so that a cavity enclosed with a cope and a drag can be completely kept airtight.

Accordingly, it is an object of the present invention to provide a method of sealing a semiconductor element mounted on a long size lead frame with resin in a vacuum state and a vacuum type resin-sealing apparatus and a long size lead frame for use in the method.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 4:
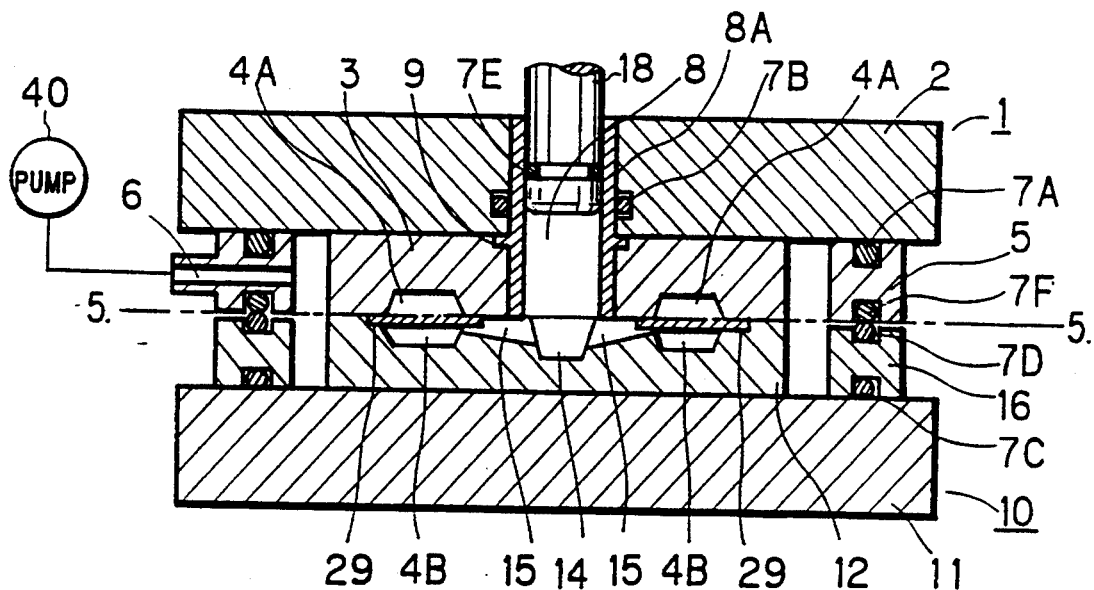
FIG. 4 is a cross-sectional view showing an embodiment of a vacuum type resin-sealing apparatus according to the present invention.
Figure 5:
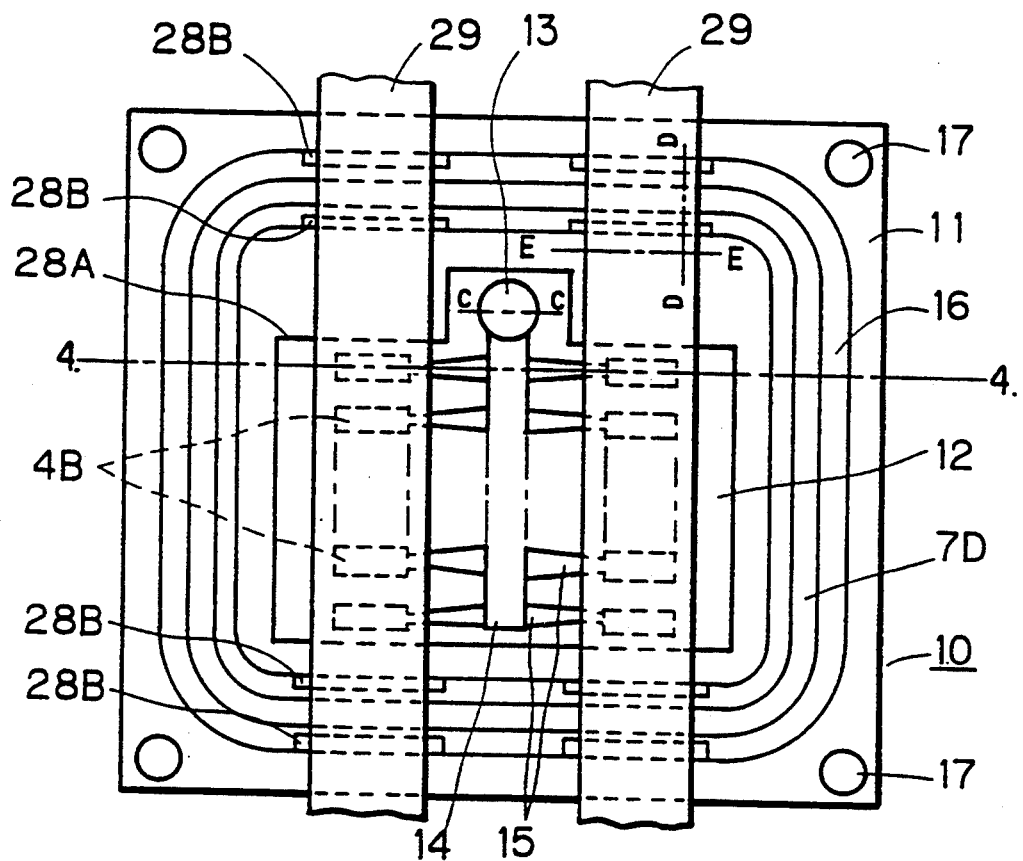
FIG. 5 is a plan view showing a drag in FIG. 4.

FIG. 4 is a cross-sectional view showing an embodiment of a vacuum type resin-sealing apparatus according to the present invention. This resin-sealing apparatus comprises a cope 1 and a drag 10 disposed on opposite sides of a parting plane A—A. FIG. 5 is a plane view showing the drag 10 viewed from the parting plane A—A. The cross section of the drag 10 of FIG. 4 is taken along line B—B of FIG. 5. The cross section of the cope 1 of FIG. 4 is also taken along line B—B of FIG. 5 except for a chamber 8 and the neighborhood thereof, the cross section of which is taken along line C—C of FIG. 5

Figure 1:
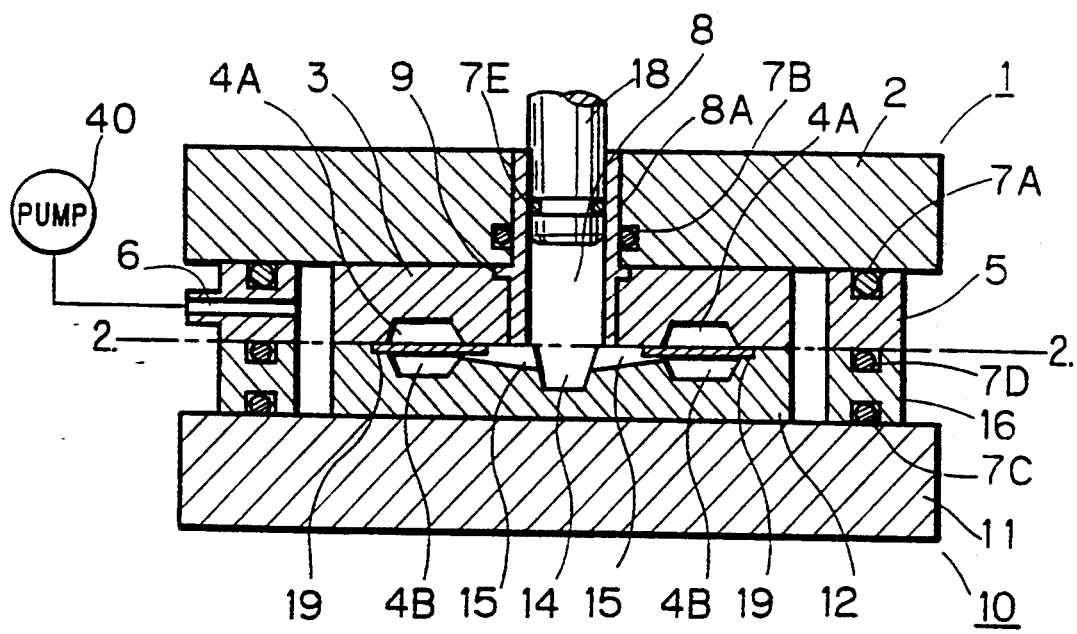
FIG. 1 is a cross-sectional view showing a conventional vacuum type resin-sealing apparatus.
Figure 2:
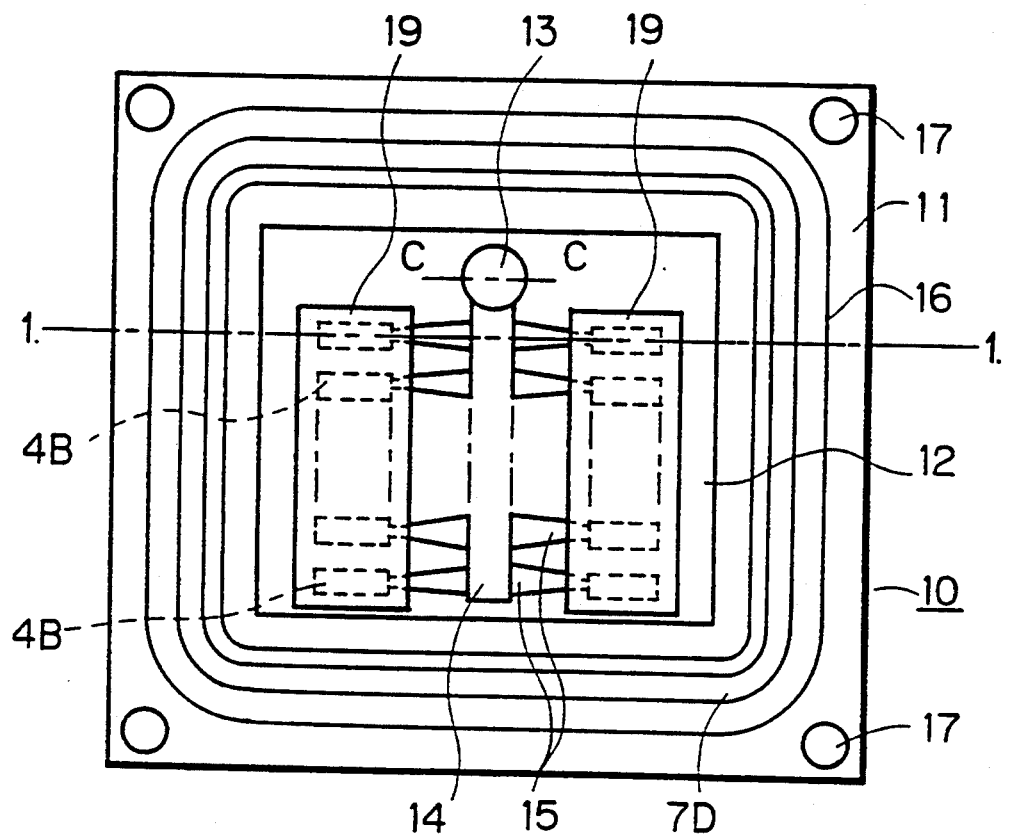
FIG. 2 is a plan view showing a drag in FIG. 1.

As shown in FIG. 5, a lower cavity block 12 and a lower seal block 16 are provided with recesses 28A and 28B, respectively. An upper cavity block 3 and an upper seal block 5 are also provided with similar recesses. The upper seal block 5 is further provided with a sealant 7F on the drag 10 side surface thereof. Other structures of the cope 1 and the drag 10 are the same as those in FIG. 1 and FIG. 2.

In FIG. 4 and FIG. 5, reference numerals 29 denote long size lead frames which pass through between the sealant 7F of the upper seal block 5 and a sealant 7D of the lower seal block 16 and are held between the upper and lower cavity blocks 3 and 12. In this embodiment, the long size lead frame 29 has the same structure as the short size lead frame 19 shown in FIG. 3 except for its length. That is, as shown in FIG. 3, the long size lead frame 29 comprises two stripe side members 20 extending in parallel at a distance and a plurality of unit lead patterns 22, the number of which is more than in the short size lead frame 19, provided between and arranged along the side members 20 at regular intervals M.

Figure 6:
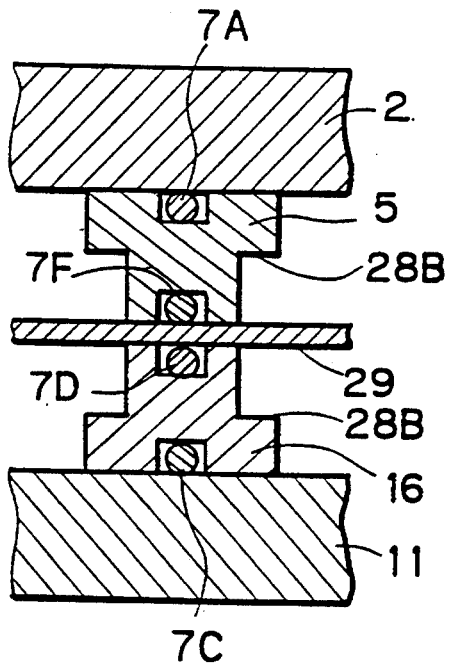
FIG. 6 is a cross-sectional view taken along line D—D of FIG. 5.
Figure 7:
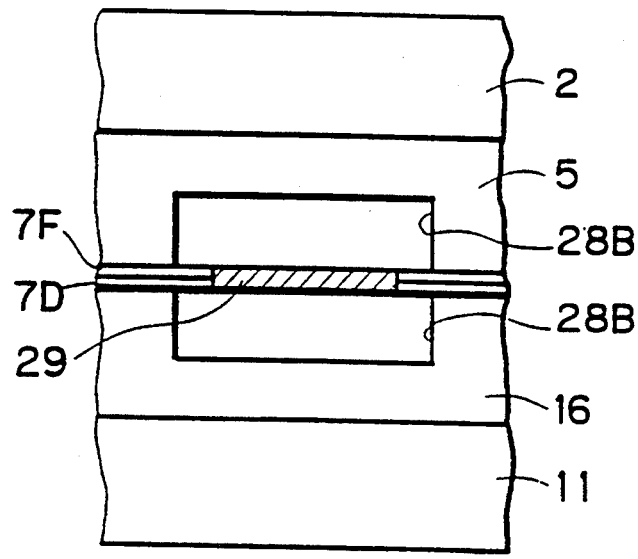
FIG. 7 is an end view taken along line E—E of FIG. 5.

A procedure of sealing a semiconductor element with resin will be described. The long size lead frame 29 is generally treated in a state bound as a loop. One end of the bound long size lead frame 29 is drawn out to be treated by the vacuum type resin-sealing apparatus. Semiconductor elements are previously mounted on element mounting pads 23 of the long size lead frame 29 and electrically connected with inner leads 25 disposed around each pad 23 through bonding wires in a pretreatment. A portion of the long size lead frame 29 is positioned on the lower cavity block 12 in a manner that each semiconductor element on the element mounting pad 23 is located in the center of each cavity 4B and then held by the cope 1 and the drag 2 clamped by a clamp machine (not shown). FIG. 6 and FIG. 7 are cross-sectional and end views taken along lines D—D and E—E of FIG. 5, respectively.

Figure 3:
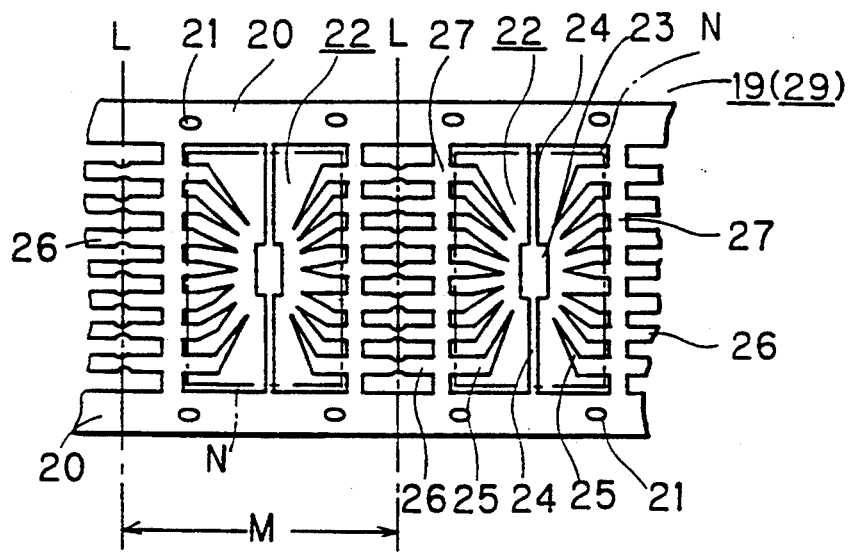
FIG. 3 is a plan view showing a portion of a conventional short size lead frame or a long size lead frame applied to the present invention.

Portions on lines L of the long size lead frame 29 shown in FIG. 3 are nipped by the sealants 7F and 7D of the upper and lower seal blocks 5 and 16. On the line L, outer leads 26 intermittently lie. This results in unevenness of a portion to be sealed of the long size lead frame 29. In accordance with this unevenness, the sealants 7F and/or 7D may be formed to be uneven in their surfaces opposite to each other, so that complete sealing can be developed between the upper and lower seal blocks 5 and 16 and the long size lead frame 29.

Then, preheated tablet resin is put in the chamber 8. The sealant 7A to 7F completely seal between upper and lower walls 2 and 11, the upper and lower seal blocks 5 and 16, a chamber wall 8A, a plunger 18 and the long size lead frame 29 so that the airtight of an inner space enclosed with these is kept. Then, the same procedures as those hereinbefore described with respect to FIG. 1 and FIG. 2 take place, so that the resin is molded to the long size lead frame 29 in a region N surrounded with a dashed line of FIG. 3 and each semiconductor element mounted on the pad 23 is sealed in the molded resin.

Thereafter, the cope 1 and drag 2 are opened by moving the cope 1 upward, in order to pass the long size lead frame 29 by a predetermined distance in the longitudinal direction. Thus, the long size lead frame is again positioned on the lower cavity block 12 in a manner that each semiconductor element not yet sealed with the resin is located in the center of each cavity 4B. The cope 1 is moved downward so that the cope 1 and the drag 2 are clamped and, thereafter, the resin is injected in the cavities 4A and 4B to seal the semiconductor elements mounted on the pads 23 as described above. Since the upper and lower cavity blocks 3 and 12 and the upper and lower seal blocks 5 and 16 are provided with the recesses 28A and 28B, they and resins molded on the long size lead frame 29 never interfere. Thus, semiconductor elements mounted on the long size lead frame 29 are sequently sealed with resin.

Figure 8:
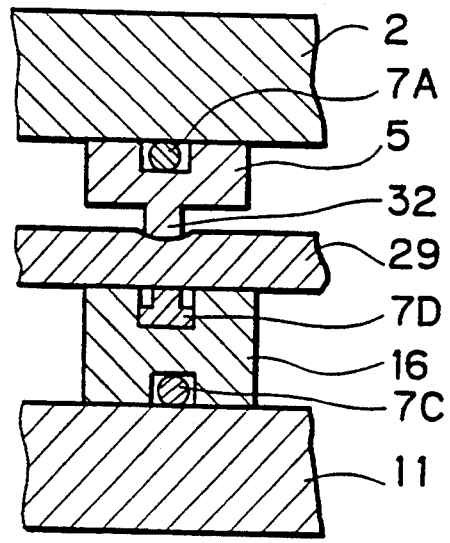
FIG. 8 and FIG. 9 are cross-sectional views showing sealing portions in other embodiments of the vacuum type resin-sealing apparatus according to the present invention.

FIG. 8 is a cross-sectional view, similar to FIG. 6, showing a sealing portion in another embodiment of the vacuum type resin-sealing apparatus according to the present invention. In this embodiment, the recesses 28B in the above embodiment are deleted. An upper seal bock 5 has a protruding portion 32 of a relatively small width in place of the sealant 7F in the above embodiment. A sealant 7D of a lower seal block 16 may have a projecting configuration as shown in FIG. 8. In this embodiment, a long size lead frame 29 may be formed of a soft and flexible material such as copper alloy of high copper content. When the long size lead frame 29 is pressed by the protruding portion 32 of a relatively small width, the pressed portion of the long size lead frame 29 is deformed to be concave so that complete sealing can be developed.

Figure 9:
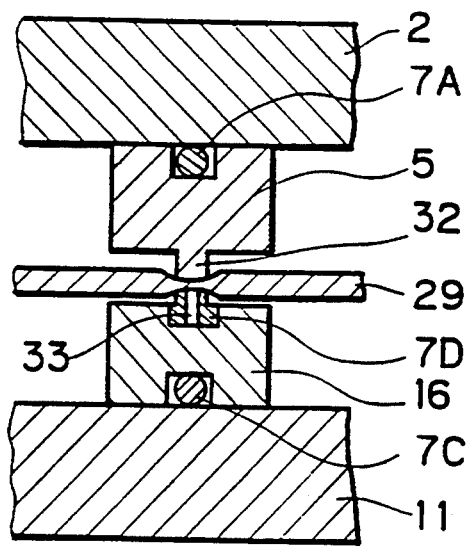

The projection type sealant 7D of the lower seal block 16 may be comprised with a plate 33 formed of relatively deformable metal such as copper in its central portion as shown in FIG. 9. The sealant 7D may be formed of silicone rubber or the like. In this case, when the long size lead frame 29 is nipped by the protruding portion 32 of the upper seal block 5 and the sealant 7D of the lower seal block 16, the nipped portions of the both sides of the long size lead frame 29 are deformed to be concave so that complete sealing can be implemented.

Figure 10:
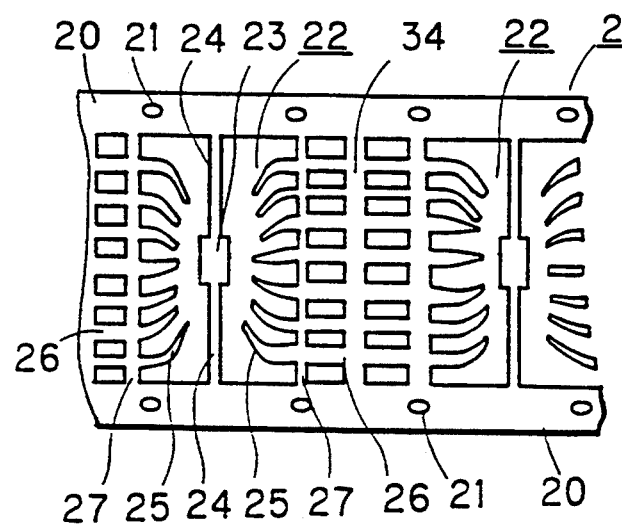
FIG. 10 to FIG. 12 are plan views showing embodiments of a long size lead frame according to the present invention.
Figure 11:
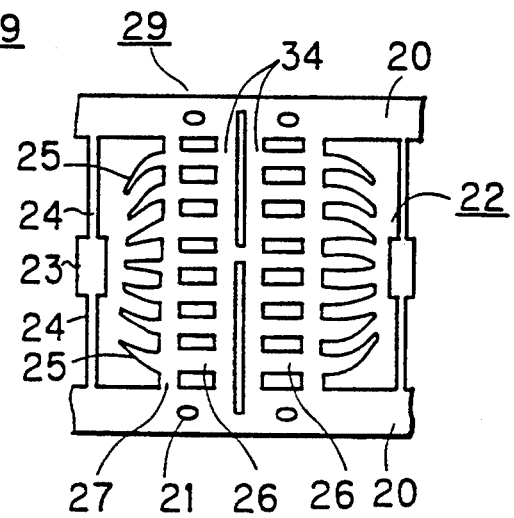

FIG. 10 is a plan view showing an embodiment of a long size lead frame according to the present invention. In this embodiment, a continuing part 34 is provided at an intermediate portion between adjacent lead patterns 22 corresponding to the line L of FIG. 3. The continuing part 34 extends from one of side members 20 to the other in a direction perpendicular to the side members 20. Other structures are the same as those of the long size lead frame 29 shown in FIG. 3. This long size lead frame 29 is positioned with respect to the vacuum type resin-sealing apparatus shown in FIG. 6, FIG. 8 or FIG. 9 in a manner that the continuing part 34 is located at the sealants 7D and 7F or at the sealant 7D and the protruding portion 32. Thus, sealing becomes easy and complete because of evenness of the surface of the continuing part 34. A tie bar 27 may be deleted since the continuing part 34 connects outer leads 26 with each other and support them on the side members 20. A pair of continuing parts 34 may be provided as shown in FIG. 11, to nip them by the sealant 7D and 7F or by the sealant 7D and the protruding portion 32.

Figure 12:
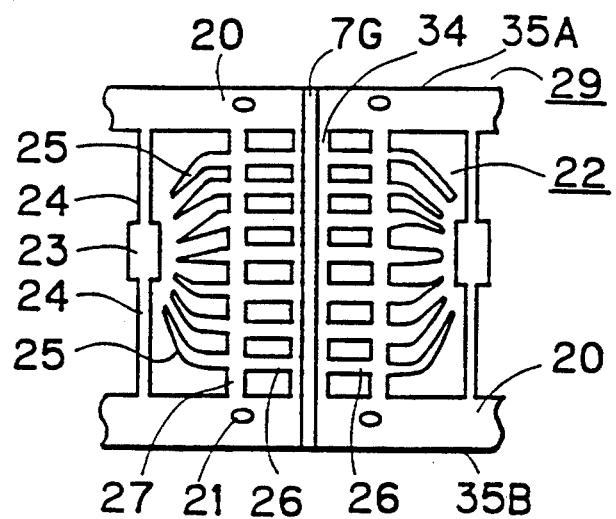
Figure 13:
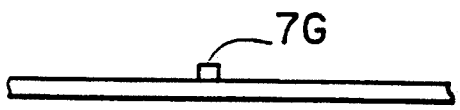
FIG. 13 is a side elevation of FIG. 12.

FIG. 12 is a plan view showing another embodiment of the long size lead frame according to the present invention, and FIG. 13 is a side elevation thereof. In this embodiment, a long size lead frame 29 has a continuing part 34 similar to that of the embodiment shown in FIG. 10. The continuing part 34 is provided thereon with a sealant 7G formed of silicone rubber or teflon. The sealant 7G extends from one end 35A of the long size lead frame 29 to the other end 35B and is attached to the continuing part 34. Other structures are the same as those of the long size lead frame 29 shown in FIG. 10.

Figure 14:
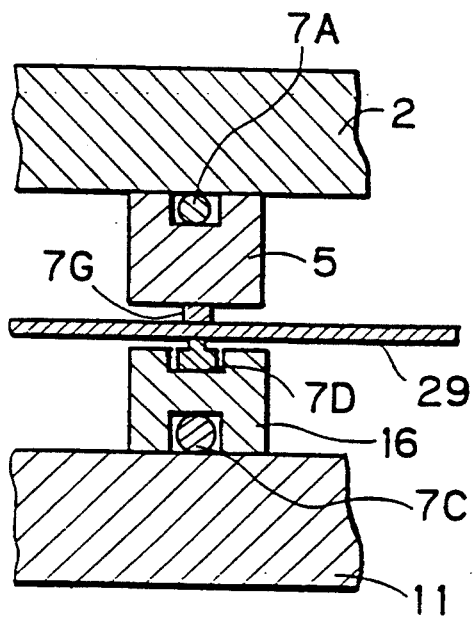
FIG. 14 is a cross sectional view showing a sealing portion in the case where the long size lead frame shown in FIGS. 12 and 13 is employed.
Figure 15:
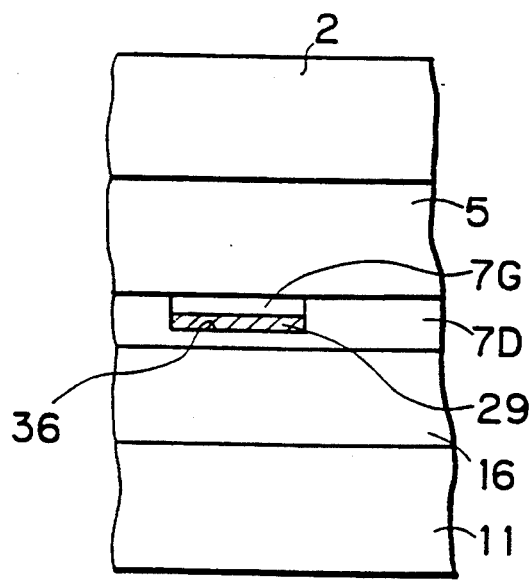
FIG. 15 is a side elevation of FIG. 14.

FIG. 14 is a cross-sectional view showing a sealing partion of a vacuum type resin-sealing apparatus wherein the long size lead frame 29 shown in FIG. 12 and FIG. 13 is employed. FIG. 15 is a side elevation of FIG. 14. This vacuum type resin-sealing apparatus has the same structure as the conventional apparatus shown in FIG. 1 and FIG. 2 except that a sealant 7D has a projecting configuration and is provided with a recess 36 in accordance with the configuration of the long size lead frame 29 as shown in FIG. 15. In this embodiment, the sealant 7D seals between a lower seal block 16 and the long size lead frame 29 as well as an upper seal block 5 and the sealant 7G seals between the upper seal block 5 and the long size lead frame 29. Therefore, complete sealing can be implemented although the upper seal block 5 is not provided with a sealant on its drag side surface. The sealant 7G may be provided on the line L of the long size lead frame 29 shown in FIG. 3. In this case, complete sealing can be developed by adapting the sealant 7G and/or sealant 7D to enter between outer leads 26.

Although the present invention has been described and illustrated in detail, it is clearly understood that the same is by way of illustration and example only and is not to be taken by way of limitation. The spirit and scope of the present invention being limited only by the terms of the appended claims.

What is claimed is:

1. A method of sealing a semiconductor element mounted on a long size lead frame with resin by using a vacuum type resin-sealing apparatus having a cope and a drag, said cope comprising an upper wall, an upper cavity block provided on an underside of said upper wall and an upper seal block provided on the underside of said upper wall to surround said upper cavity block, said drag comprising a lower wall, a lower cavity block provided on top of said lower wall and a lower seal block provided on the top of said lower wall to surround said lower cavity block, comprising the steps of:
    (a) nipping a portion of said long size lead frame by said cope and drag to seal between said upper seal block, said lower seal block and said long size lead frame;
    (b) evacuating a cavity enclosed within said upper and lower cavity blocks; and
    (c) injecting resin into said cavity to seal said semiconductor element with said resin;
    wherein one of said upper and lower seal blocks is provided with a sealant,
    the other of said upper and lower seal blocks is provided with a protruding portion,
    said long size lead frame is formed of a deformable metal material, and
    said step (a) includes the step of deforming said long size lead frame to be concave by pressing said long size lead frame by said protruding portion to seal between said other of said upper and lower seal blocks and said long size lead frame and sealing between said one of said upper and lower seal blocks and said long size lead frame by said sealant; and
    wherein said sealant is provided therein with a deformable metal plate,
    said step (a) further includes the step of deforming said long size lead frame to be concave by pressing said long size lead frame by said sealant to seal between said one of said upper and lower seal blocks and said long size lead frame.

2. A vacuum type resin-sealing apparatus for sealing a semiconductor element mounted on a long size lead frame with resin, comprising:
    a cope and a drag provided opposite to each other with respect to a parting plane, said cope comprising an upper wall, an upper cavity block provided on an underside of said upper wall and an upper seal block provided on the underside of said upper wall to surround said upper cavity block, said drag comprising a lower wall, a lower cavity block provided on a top of said lower wall and a lower seal block provided on the top of said lower wall to surround said lower cavity block;
    sealing means for sealing between said upper seal block, said lower seal block and said long size lead frame in a state where a portion of said long size lead frame is nipped by said cope and drag;
    evacuating means for evacuating a cavity enclosed within said upper and lower cavity blocks; and
    injecting means for injecting resin into said cavity to seal said semiconductor element with said resin;
    wherein said long size lead frame is formed of a deformable metal material, and
    said sealing means includes a sealant provided on one of said upper and lower seal blocks and a protruding portion provided on the other of said upper and lower seal blocks to press and deform said long size lead frame; and
    wherein said sealant is provided therein with a deformable metal plate for pressing and deforming said long size lead frame.

3. A method of sealing a semiconductor element mounted on a long size lead frame with resin by using a vacuum type resin-sealing apparatus having a cope and a drag, said cope comprising an upper wall, an upper cavity block provided on an underside of said upper wall and an upper seal block provided on the underside of said upper wall to surround said upper cavity block, said drag comprising a lower wall, a lower cavity block provided on top of said lower wall and a lower seal block provided on the top of said lower wall to surround said lower cavity block, comprising the steps of:
    (a) nipping a portion of said long size lead frame by said cope and drag to seal between said upper seal block, said lower seal block and said long size lead frame;
    (b) evacuating a cavity enclosed within said upper and lower cavity blocks; and
    (c) injecting resin into said cavity to seal said semiconductor element with said resin;
    wherein said upper and lower seal blocks are provided with first and second sealants, respectively, and
    said step (a) includes the step of sealing between said upper seal block, said lower seal block and said long size lead frame by said first and second sealants; and
    wherein said long size lead frame has a plurality of lead patterns and is provided with a pair of continuing parts between adjacent said lead patterns, and said step (a) includes the step of nipping said pair of continuing parts by said first and second sealants.

4. A vacuum type resin-sealing apparatus for sealing a semiconductor element mounted on a long size lead frame with resin, comprising:
    a cope and a drag provided opposite to each other with respect to a parting plane, said cope comprising an upper wall, an upper cavity block provided on an underside of said upper wall and an upper seal block provided on the underside of said upper wall to surround said upper cavity block, said drag comprising a lower wall, a lower cavity block provided on a top of said lower wall and a lower seal block provided on the top of said lower wall to surround said lower cavity block;
    sealing means for sealing between said upper seal block, said lower seal block and said long size lead frame in a state where a portion of said long size lead frame is nipped by said cope and drag;
    evacuating means for evacuating a cavity enclosed within said upper and lower cavity blocks; and
    injecting means for injecting resin into said cavity to seal said semiconductor element with said resin;
    wherein said sealing means includes first and second sealants provided on said upper and lower seal blocks, respectively; and
    wherein said long size lead frame has a plurality of lead patterns and is provided with a pair of continuing parts between adjacent said lead patterns to be nipped by said first and second sealants.

* * * * *